United States Patent [19]
Cartier

[11] Patent Number: 5,116,244
[45] Date of Patent: May 26, 1992

[54] CONNECTOR FOR COAXIAL CABLE

[75] Inventor: Jacques Cartier, Fontenay-Sous-Bois, France

[73] Assignee: Radiall, Rosny-Sous-Bois, France

[21] Appl. No.: 706,885

[22] Filed: May 29, 1991

[30] Foreign Application Priority Data

May 30, 1990 [FR] France ................... 9006722

[51] Int. Cl.⁵ ............................................. H01R 17/04
[52] U.S. Cl. ................................. 439/578; 439/510; 439/581
[58] Field of Search ........................ 439/578–585, 439/675, 509–514, 92

[56] References Cited

U.S. PATENT DOCUMENTS

| | | | |
|---|---|---|---|
| 3,488,625 | 1/1970 | Collin | 439/581 |
| 4,398,783 | 8/1983 | Kelly et al. | 439/581 |
| 4,453,798 | 6/1984 | Cesick et al. | 439/581 |
| 4,494,816 | 1/1985 | Tamburro | 439/581 |
| 4,964,814 | 10/1990 | Tengler et al. | 439/581 |
| 5,013,261 | 5/1991 | Seisz et al. | 439/581 |

FOREIGN PATENT DOCUMENTS 8605035 8/1986 European Pat. Off. .
0341535 4/1989 European Pat. Off. .
2192395 7/1973 France .

OTHER PUBLICATIONS

"Automated Probing of High-Spped Analog/Mixed Boards", Electronics Test, vol. 11, No. 6, pp. 76–82.

Primary Examiner—David L. Pirlot
Attorney, Agent, or Firm—Schweitzer Cornman & Gross

[57] ABSTRACT

The invention relates to a connector for separably connecting a coaxial cable to a pair of parallel, spaced conductive pins, particularly the output contact pins of an integrated circuit. It includes a tubular conductive body (13) adapted to be affixed to the outer conductor (14) of the coaxial cable (1) at the end of the latter, and provided internally with means (15) for separably connecting the central conductor (16) of the coaxial cable to one of the pins (7), the tubular body having, near the end of the coaxial cable, a conductive tubular arm (18) with an axis parallel to the axis of the tubular body, and in contact with the outer conductor of the coaxial cable, the arm being arranged to receive removably contact means (21, 22, 23) adapted to provide an electrical contact with the second pin (8) and the tubular arm (18).

3 Claims, 1 Drawing Sheet

CONNECTOR FOR COAXIAL CABLE

BACKGROUND OF THE INVENTION

The present invention relates to a connector to be mounted at the end of a coaxial cable to connect the coaxial cable in a separable manner to a pair of parallel, spaced-apart conductor pins, particularly the contact pins exiting from an integrated circuit.

SUMMARY OF THE INVENTION

The connector according to the present invention, in one particular application, is to be used for connecting a coaxial input cable for an ultrahigh frequency measuring apparatus for measuring and checking the characteristics of a microwave integrated circuit encapsulated in a hermetically sealed can. In this case the pins are shafts passing through and hermetically sealed to a metal plate on which the integrated circuit is mounted, and which plate is integral with the sealed container capsule. One of the pins is connected to an active track or lead of the integrated circuit receiving the signal from an active microwave component of the integrated circuit, the other pin is connected to a ground track or lead of the integrated circuit.

Integrated microwave circuits with their active components are in practice encapsulated in hermetically sealed containers closed by a metal plate having hermetically sealed leads whose number corresponds to the number of conductive pins of the integrated circuit which project from the can.

The hermetic sealing of the leads of the metal plate is accomplished by means of glass beads which seal the corresponding pin in orifices formed in the plate for the passage of the pins.

The hermetically sealed can holding the integrated microwave circuit is adapted to be mounted on a printed circuit board having holes and metallized tracks for soldering the pins or shafts exiting from the encapsulated integrated circuit as well as for any other component which is to be mounted on the printed circuit board.

Before finally installing the integrated microwave circuit encapsulated in its container on the printed circuit board it is necessary to measure and check the ultrahigh frequency characteristics of the circuit, and particularly the characteristics of each of its active microwave components.

The circuits presently used operate up to frequencies of several GHz, for example three GHz and, to measure the characteristics of each active component, it is necessary to connect it to a coaxial cable connected to the measuring apparatus through a pair of pins connected respectively to the active track of the active microwave component and the other to the ground track.

The invention proposes a connector for this purpose, which includes a conductive tubular body adapted to be affixed to the external conductor of the coaxial cable at the end thereof, and internally provided with means for connecting the central conductor of the said coaxial cable in a separable manner to one of the pins, viz., the pin of the active track in the application in question, the tubular body having, near the end of the coaxial cable, a tubular conductive arm whose axis is parallel to the axis of the tubular body, and which is in contact with the outer conductor of the coaxial cable, the arm being disposed for receiving, in a removable manner, contact means adapted to provide an electrical contact between the second pin, viz., the ground track pin in the application in question, and the tubular arm.

In one particular embodiment, there is provided for this purpose a tubular contact piece provided at one end with fixation means adapted to cooperate with complementary fixation means created inside of the tubular arm and, at its other end, means, particularly resilient means, of contact with the corresponding pin.

In a preferred embodiment, the contact piece is fixed in a removable manner inside of the annular arm by threading.

In an advantageous embodiment of the invention, the cylindrical body of the connector provided with means for contact with the first pin (active track pin) and the means for contact with the second pin (ground track pin) are placed in respective parallel cylindrical through-bores of a base on which they are immobilized by retaining means such as offset portions which abut against opposite faces of the base.

When it is desired to measure, through a coaxial cable, the characteristics of one of several active microwave components of an integrated circuit, it is possible, according to a particular feature of the invention, to provide a base having a plurality of pairs of cylindrical bores formed in an arrangement, corresponding to that of the pair of pins (one for the active track and one for the ground track), which are to be connected to a coaxial cable connected to an ultrahigh frequency apparatus.

For the purpose of better understanding the invention, reference should be made to the following description, in conjunction with the appended drawing, which illustrates an embodiment of the invention. The illustration is intended to be exemplary and not restrictive.

DETAILED DESCRIPTION OF THE INVENTION

Figure 1:
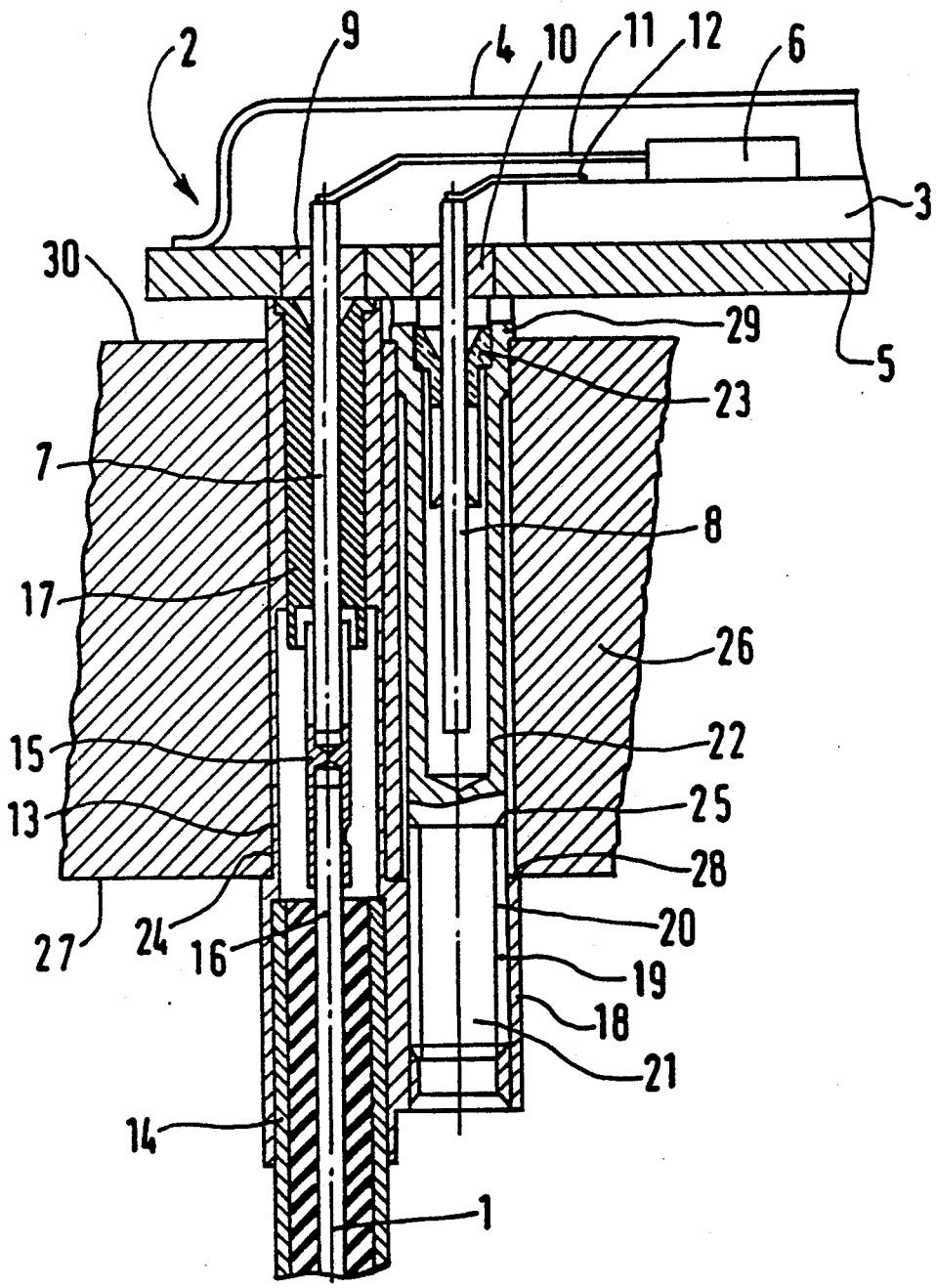
FIG. 1 is a cross-sectional view of a connector in accordance with the invention.

In the drawing is illustrated a connector according to the invention for creating a connection through the medium of a coaxial cable 1 between an electronic component to be tested, generally indicated at 2, and a measuring apparatus not shown.

In the illustrated example, the electronic component is a microwave integrated circuit 3 encapsulated in a hermetically sealed container or can 4 having a metal plate 5. The measurement and control operations relate to the ultrahigh frequency characteristics of an active microwave component 6 of the integrated circuit.

Parallel, spaced contact pins 7 and 8 project and exit from the plate 5 through orifices sealed by glass beads 9 and 10, respectively, the pin 7 being affixed at its extremity to an active track 11 of the integrated circuit corresponding to the active component 6 and the pin 8 being connected to the ground track 12 of the integrated circuit.

The connector according to the invention includes a tubular conductor body 13 adapted to be affixed, particularly by soldering, to the outer conductor 14 of the coaxial cable 1, the body 13 having at its interior a central contact 15 in the form of a double-end socket affixed at one end, by soldering, to the central conductive core 16 of the coaxial cable and having at its opposite end a spring contact to engage the pin 7. The body 13 further includes a tubular insulator 17 extending for a portion of its length from the end of the body 13 at the plate 5.

In the vicinity of its contact with the coaxial cable 1, the body 13 includes a conductive tubular arm 18 preferably fabricated integrally therewith and having a thread 19 into which is threaded a corresponding thread 20 formed on a cylindrical end portion 21 of a tubular piece 22 which is provided proximate to its other end with a spring contact 23 to provide electrical continuity between the pin 8, around which the piece 22 and the contact 23 are engaged and the conductive arm 18, and therefore the outer conductor 14 of the coaxial cable 1.

In the example shown, the body 13 provided with the arm 18 and affixed to the coaxial cable, and the piece 22, are respectively disposed in cylindrical bores 24 and 25 extending through a base 26.

The body 13 installed at the end of the coaxial cable is introduced (upwardly in the drawing), into the corresponding bore 2 of the base 26 and stops against an end face 27 of the base by virtue of an offset abutment 28 of the arm 18.

The piece 22 is introduced into the base 26 from the other side thereof in the second bore 25 and is affixed to the body 13 by threading its cylindrical end portion 21 into the arm 18.

At its end opposite the portion 21, the piece 22 includes an offset collar 29 which rests against the face 30 of the base opposite the side 27.

The pins 7 and 8 of an electronic component can then be connected simultaneously to a single assembly thus formed by plugging in the component (downwardly in the drawing).

Although the present invention has been described in connection with one particular embodiment, it is quite evident that it is by no means limited thereto, and that many variations and modifications can be made in it without thereby departing from the scope or spirit of the invention.

I claim:

1. A connector for connecting, in a separate manner, a coaxial cable to a pair of parallel spaced pins (7,8), particularly contact pins exiting from an integrated circuit, characterized by the fact that the connector includes a conductive tubular body (13) adapted to be affixed to the outer conductor (14) of the coaxial cable (1) at the end of the latter, and internally provided with means (15) for connecting, in a separable manner, the central conductor (16) of the coaxial cable to one of the pins (7); said tubular body including, in the vicinity of the end of the coaxial cable, a conductive tubular arm (18) having an axis parallel to the axis of the tubular body, said arm being arranged for receiving, in a removable manner, contact means (21,22,23) appropriate for providing an electrical contact with the second pin (8) and said tubular arm (18); said contact means (21,22,23) including a tubular contact piece (22) provided at one end with fixation means (20,21) adapted to cooperate with complimentary fixation means (19) formed inside of the tubular arm (18) and, at its other end, provided with resilient means (23) for contact with the corresponding pin (8); and said contact piece (22) being removably secured to the interior of the arm (18) by threaded means (19,20).

2. A connector according to claim 1, further characterized by the fact that the tubular body (13) and tubular arm (18) are set in parallel cylindrical bores (24,25) of a base (26) on which they are secured by retaining means in the form of offset portions (28,29) abutting against opposite faces (27,30) of the base.

3. A connector according to claim 1, characterized by the fact that the connector includes a base (26) having a plurality of pairs of parallel bores in a predetermined arrangement corresponding to a plurality of pairs of contact pins.

* * * * *